(12) United States Patent
Geneczko (10) Patent No.: US 7,915,585 B2
(45) Date of Patent: Mar. 29, 2011

(54) MICROBOLOMETER PIXEL AND FABRICATION METHOD UTILIZING ION IMPLANTATION

(75) Inventor: Jeannie Geneczko, Carlisle, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 184 days.

(21) Appl. No.: 12/414,766

(22) Filed: Mar. 31, 2009

(65) Prior Publication Data

US 2010/0243896 A1    Sep. 30, 2010

(51) Int. Cl.
G01J 5/00    (2006.01)

(52) U.S. Cl. .................................... 250/338.1

(58) Field of Classification Search .... 250/338.1 –338.5
See application file for complete search history.

(56) References Cited

U.S. PATENT DOCUMENTS

| | | |
|---|---|---|
| 4,333,808 A | 6/1982 | Bhattacharyya et al. |
| 5,450,053 A | 9/1995 | Wood |
| 5,602,393 A | 2/1997 | Gerard |
| 5,629,665 A | 5/1997 | Kaufmann et al. |
| 6,144,030 A | 11/2000 | Ray et al. |
| 6,144,285 A | 11/2000 | Higashi |
| 6,320,189 B1 * | 11/2001 | Ouvrier-Buffet et al. . 250/338.4 |
| 6,690,014 B1 * | 2/2004 | Gooch et al. ............... 250/338.4 |
| 7,268,350 B1 | 9/2007 | Ouvrier-Buffet et al. |
| 7,491,938 B2 | 2/2009 | Geneczko et al. |
| 2006/0118721 A1 * | 6/2006 | Antoszewski et al. ..... 250/338.4 |
| 2007/0272864 A1 | 11/2007 | Li et al. |
| 2009/0050808 A1 * | 2/2009 | Ushimi et al. ............. 250/338.3 |

OTHER PUBLICATIONS

Vieider et al., "Low-cost far infrared bolometer camera for automotive use," 2007, Proceedings of SPIE, vol. 6542, pp. 65421L-1-6542L-10.*
Naguib, H.M. et al., "On the Increase in the Electrical Conductivity of $MoO_3$ and $V_2O_5$ Following Ion Bombardment", Journal Phys. Chem. Solids, 1972, pp. 1751-1759, vol. 33, Pergamon Press, Great Britain.
PCT Search Report dated May 21, 2010 of Patent Application No. PCT/US10/27781 filed Mar. 18, 2010.

* cited by examiner

*Primary Examiner* — David P Porta
*Assistant Examiner* — Kiho Kim
(74) *Attorney, Agent, or Firm* — Vern Maine & Associates; David A. Rardin (57) ABSTRACT

A microbolometer pixel and a reduced-step process for manufacturing it comprising the step of ion implantation of vanadium oxide whereby $VO_x$ is converted to a low resistivity mixed phase vanadium oxide ($VO_x/V_2O_3/VO/V$) in the leg, metallized support post, and detector contact areas. Masking maintains high temperature coefficient of resistance (TCR) $VO_x$ in the sensing portion of the pixel bridge region. The implanted area resistivity and TCR can be controlled by ion implantation dose and energy.

20 Claims, 8 Drawing Sheets

MICROBOLOMETER PIXEL AND FABRICATION METHOD UTILIZING ION IMPLANTATION

FIELD OF THE INVENTION

The present invention relates to microbolometers and more particularly to microbolometer pixels fabricated utilizing ion implantation.

BACKGROUND OF THE INVENTION

One type of an infrared detector consists of a microbolometer responsive to the heat energy of infrared radiation. These microbolometers are typically grouped on a single substrate into an array of microbolometers. Microbolometer construction includes a sensor portion or pixel bridge, readout circuitry, and interconnections. In certain microbolometers, the pixel bridge is formed from an oxide of vanadium ($VO_x$), which has a high temperature coefficient of resistance (TCR) making it an excellent IR sensing material.

A conductive path is needed to provide the electrical connection between the vanadium oxide ($VO_x$) of the pixel bridge and the underlying readout integrated circuit (ROIC). Part of this connection is a metal trace leading from the pixel bridge to the metal support structure. This metal trace is sometimes referred to as the leg. Ideally, the $VO_x$ deposited for the bridge could also act as the material for the electrical interconnect. However, the $VO_x$ used in the pixel bridge cannot be used as the electrical trace because it is not metallic; i.e., its electrical resistance is too high.

The use of a metal or metal alloy such as NiCr as the electrical interconnect requires significant additional processing such as extra insulating dielectric, metal deposition, and multiple associated added photolithography, etching and cleaning steps. The added steps occur whether the metal interconnect process is done before or after $VO_x$ deposition.

Each step arising from the need for the added metallization negatively affects the cost and schedule of building microbolometers, and increases the chance of lower yield due to loss of pixels and die from the multiple processing steps. Such steps can also produce more particulates with a further impact on yield. In addition, as state of the art pushes pixels to become ever smaller and the films thinner, these processing steps become more difficult to scale for smaller geometries. For example, continuous step coverage of the thin metal over the dielectric into the detector contact area becomes a more significant issue if the topology of the pixel is not minimized.

An alternative leg approach involves back-sputtering the $VO_x$ to change its electrical properties. An example includes U.S. Pat. No. 6,144,285 to Higashi incorporated herein by reference. Here, exposed microbolometer legs are subjected to argon gas back-sputtering to decrease the resistance of the $VO_x$ by converting it to another form of vanadium oxide. Back-sputtering, however, erodes the protective dielectric in the bridge area, particularly the edges, which can lead to electrical shorts along the perimeter of the bridge. Increasing the back-sputtering energy for still lower resistance results in higher erosion of the protective oxide or dielectric. In addition, back-sputtering is primarily a surface phenomenon and has poor control over the conversion depth of the $VO_x$ resulting in less predictable leg resistances. Back-sputtering with argon is essentially a cleaning process and does not provide the desired control. Finally, back-sputtering does not address converting the $VO_x$ at the interface of the leg contact to the metal support structure. Excessive contact resistance in this area degrades device performance.

A need, therefore, exists for fabrication methods using highly controllable, precise, reproducible means and supporting fewer steps leading to better scaling, lower cost, faster production, and greater yield.

SUMMARY OF THE INVENTION

Embodiments of the present invention achieve these objectives by eliminating the insulating dielectric and replacing the metal leg fabrication and associated steps with ion implantation in selected areas. Ion implantation is a highly controllable, precise and reproducible process. Ion implantation is a well understood semiconductor processing technique in which accelerated ions are directed onto a material. Two precisely controlled parameters called ion energy (KeV) and ion dose (ions/cm$^2$) determine how deep and how much the material is altered.

Some lower oxides in the vanadium oxide family, e.g., $V_2O_3$ or VO, are metallic at room temperature and appropriate for the legs. They have a lower TCR than $VO_x$ but higher TCR than the metallization typically used. Transition metal oxides can be reduced and their resistivity significantly lowered by bombarding them with ions. This same phenomenon can be applied to selective areas of the $VO_x$ material originally deposited and convert these areas to low resistivity mixed phase vanadium oxide outside of the sensing area of the bridge. The addition of an implant mask, removal of a protect dielectric, followed by an ion implant to convert the $VO_x$ to mixed phases of $VO_x/V_2O_3/VO/V$ in the leg and adjacent areas such as the detector contact area and metal post area provide for the low resistivity metal interconnect.

The amount of $VO_x$ converted depends on the implant energies and implant doses used and the amount of $VO_x$ converted controls the resistance change. For example, the amount of $VO_x$ converted to $V_2O_3$ pushes the resistivity to the $10^{-2}$ Ω-cm range. The amount of $VO_x$ converted to VO pushes the resistivity to the $10^{-3}$ Ω-cm range. The amount of VOx converted to V pushes the bulk resistivity to the $10^{-5}$ Ω-cm range. The resistivity of the mixed phase $VO_x/V_2O_3/VO/V$ will depend on the proportions of the individual phases of $VO_x$, $V_2O_3$, VO, and V. Finally, with the use of an implant mask such as photoresist, the $VO_x$ areas to be converted can be accurately defined.

Ion implantation allows for special implants when necessary with just an added photoresist mask and implant in critical areas where even lower resistance is needed such as in the leg contact area to the metallized support post. For example, a higher dose implant in this area will allow the mixed phase vanadium oxide here to have a lower electrical resistivity value than the mixed phase vanadium oxide in the detector contact area.

In addition, ion implantation allows for other variations in the implant process, e.g., different implant ions such as argon, krypton or nitrogen can be used, with further control of the conversion process. As an example, implantation with nitrogen ions may be used to convert some of the $VO_x$ to VN (vanadium nitride) instead of $V_2O_3$.

An added benefit is that replacing the prior art metallization process with ion implantation conversion improves device performance by increasing the sensing area of the bridge (smaller metallized area required), smaller thermal mass of the bridge (no insulating dielectric or added metal), higher TCR of the mixed phase vanadium oxide compared to an alloy like NiCr (better sensitivity), and lower thermal conductance of the mixed phase vanadium oxide in the leg. In other words, the converted area for the detector contact occupies less of the sensing portion of the bridge, has a higher TCR than metallization, is without added metal and contributes to thermal detection by increasing the effective sensing area of the microbolometer pixel and lowering the bridge thermal mass.

Ion implantation conversion of the $VO_x$ to replace the metallization gives a more robust pixel by a truly planar process and minimizes step coverage problems. It is also more amenable to next-generation small pixel processing. It significantly reduces the number of processing steps. It improves yield and reduces cost and schedule. It also improves pixel performance. Additionally, it can be applied to small and to large pixel processing geometries to improve yield, cost and schedule.

According to embodiments of the present invention, the above objectives are achieved by replacing the metallization process and associated steps with an ion implantation process. This process provides the electrical connection required to link the suspended pixel with the underlying ROIC.

Embodiments of the process used to manufacture the pixel of this invention include the steps of providing a ROIC with a sacrificial layer that contains a metal post or metallized support structure, depositing a dielectric and opening vias to the metal of the post support structure, depositing $VO_x$ and a protective dielectric, depositing an implant mask, removing the protective dielectric from at least the detector contact area, leg area, and leg contact to the metal post area, performing an implant causing conversion of the $VO_x$ to a low resistivity mixed phase vanadium oxide, stripping the implant mask, depositing a capping dielectric, forming the pixel bridge, leg area, and leg contact to metallized post by photolithography and etch and removing the sacrificial layer to free the pixel. The step of implanting can comprise a plurality of masks and implants that are directed at select discrete areas such as the leg metal contact at the metal post to further lower resistance.

A further embodiment is a focal plane array comprising a plurality of pixels manufactured according to the above process on a common substrate or ROIC.

An embodiment includes a method for manufacturing at least one microbolometer pixel comprising the steps of providing a sacrificial layer over a substrate with at least one readout integrated circuit pad wherein a post is disposed between at least one integrated circuit pad and a dielectric layer comprising at least one via to the post; forming at least one $VO_x$ layer over at least one via and the dielectric layer; depositing a second dielectric layer on the $VO_x$ layer; depositing an ion implant mask layer on the dielectric layer; patterning the mask and etching the second dielectric layer leaving a protected sensing bridge region; implanting ions whereby $VO_x$ of the $VO_x$ layer is converted to mixed phase vanadium oxide ($VO_x/V_2O_3/VO/V$) and whereby electrical resistivity of unmasked area of the $VO_x$ layer is decreased. In another embodiment, the implanted area temperature coefficient of resistance (TCR) and resistivity are controlled by at least one of ion implantation dose and ion implantation energy. In yet another embodiment, ion implanting dose is about approximately $1 \times 10^{13}$ to $5 \times 10^{17}$ ions/cm$^2$ and ion implanting energy is about approximately 2.5 KeV to 40 KeV. For a further embodiment, the implanted area includes at least one of leg, detector contact at bridge and metallized post. For yet other embodiments, the converted area contributes to thermal detection by increasing effective sensing area of the microbolometer pixel, and lower thermal conductivity in converted leg area increases thermal isolation, increasing sensitivity of the microbolometer pixel. In additional embodiments, the step of implanting comprises a plurality of masks and implants directed at select areas to further lower resistance, and ions of the ion implantation step are ions of at least one of argon, krypton, and nitrogen. Another embodiment provides that the step of ion implantation comprises nitrogen ions whereby low resistivity VN is formed in the mixed phase vanadium oxide ($VO_x/V_2O_3/VO/V$).

One more embodiment is a microbolometer pixel comprising a substrate with at least one adjacent readout integrated circuit pad wherein a post is disposed between at least one circuit pad and a first dielectric layer, the first dielectric layer comprising at least one via to the post; a $VO_x$ bridge layer disposed between the first dielectric layer and a second dielectric layer in operational contact with the post through the via; a dielectric cap disposed on the second dielectric layer and the bridge layer; and wherein the bridge layer comprises an implanted area defined by implantation of ions. For a further embodiment, the implanted area includes at least one of leg, detector contact at bridge and post. For other embodiments, conversion thickness of the implanted area is controlled by at least one of ion implantation dose and ion implantation energy, and also the implanted area resistivity and temperature coefficient of resistance (TCR) are controlled by at least one of ion implantation dose and ion implantation energy. In yet other embodiments, conversion thickness of the implanted area is controlled by the implantation of ions from about approximately 100 Angstroms to the thickness of the $VO_x$ layer and the implanted area resistivity is about approximately 0.001 to 0.01 Ω-cm. For further embodiments, the implanted area comprises VN. Another embodiment of the microbolometer pixel further comprises a common substrate whereon a plurality of the pixels is positioned in a focal plane array (FPA).

Yet another embodiment provides a method for manufacturing at least one microbolometer pixel comprising the steps of providing a substrate with at least one readout integrated circuit pad operatively connected to at least one readout integrated circuit; depositing a sacrificial layer over the substrate; forming at least one metal-filled post between at least one readout integrated circuit pad and a first dielectric layer; forming at least one via through the first dielectric layer to at least one metal-filled post; forming at least one $VO_x$ layer over the first dielectric layer and filling at least one via; depositing a second dielectric layer on the $VO_x$ layer; depositing an ion implant photoresist mask layer on the second dielectric layer; patterning the mask and etching the second dielectric layer leaving a protected microbolometer pixel bridge sensing region; implanting ions whereby $VO_x$ of the $VO_x$ layer is converted to mixed phase vanadium oxide ($VO_x/V_2O_3/VO/V$) and electrical resistivity of desired area is decreased; removing the mask; depositing a capping dielectric layer over the microbolometer pixel region; defining leg, bridge and post areas by photolithography and etch; and removing the sacrificial layer to complete formation of at least one microbolometer pixel. For another embodiment, the substrate is a common substrate, and the method further comprises forming a plurality of the pixels in a focal plane array (FPA) on the common substrate. In an additional further embodiment, the step of implanting ions comprises nitrogen ions whereby VN is formed in the mixed phase vanadium oxide ($VO_x/V_2O_3/VO/V$).

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIGS. 1 through 7 are a sequence of schematic drawings showing the steps in the process of manufacturing an embodiment of the present invention.

DETAILED DESCRIPTION

A pixel and a process for manufacturing a microbolometer pixel using ion implantation according to the present invention is described as follows.

Figure 1:
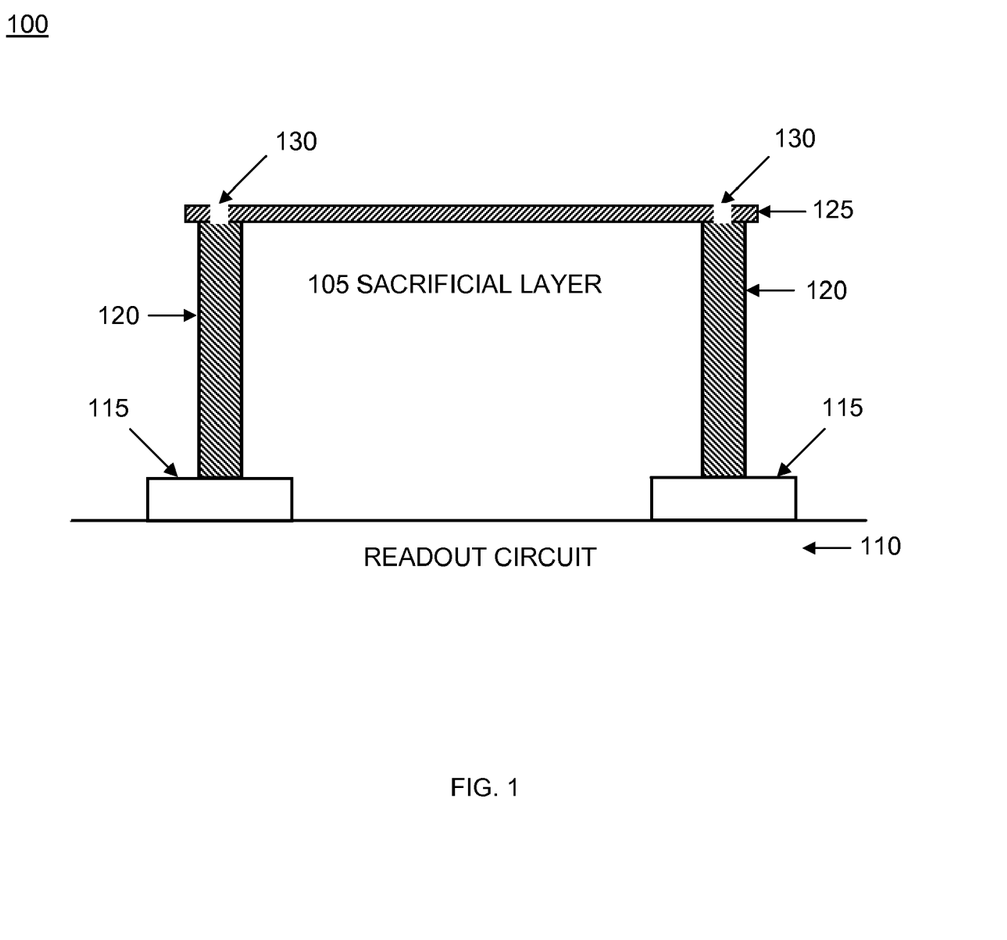
FIG. 1 is a cross section view of an initial fabrication step configured in accordance with an embodiment.

FIG. 1 is a cross section view of the initial fabrication steps 100 depicting elements around sacrificial layer 105. Underlying readout integrated circuit (ROIC) 110 has metalized pads 115 providing electrical connection to metal filled posts 120. First dielectric layer 125 is adjacent metal filled posts 120. Contact openings 130 penetrate first dielectric 125 to metal posts 120.

Figure 2:
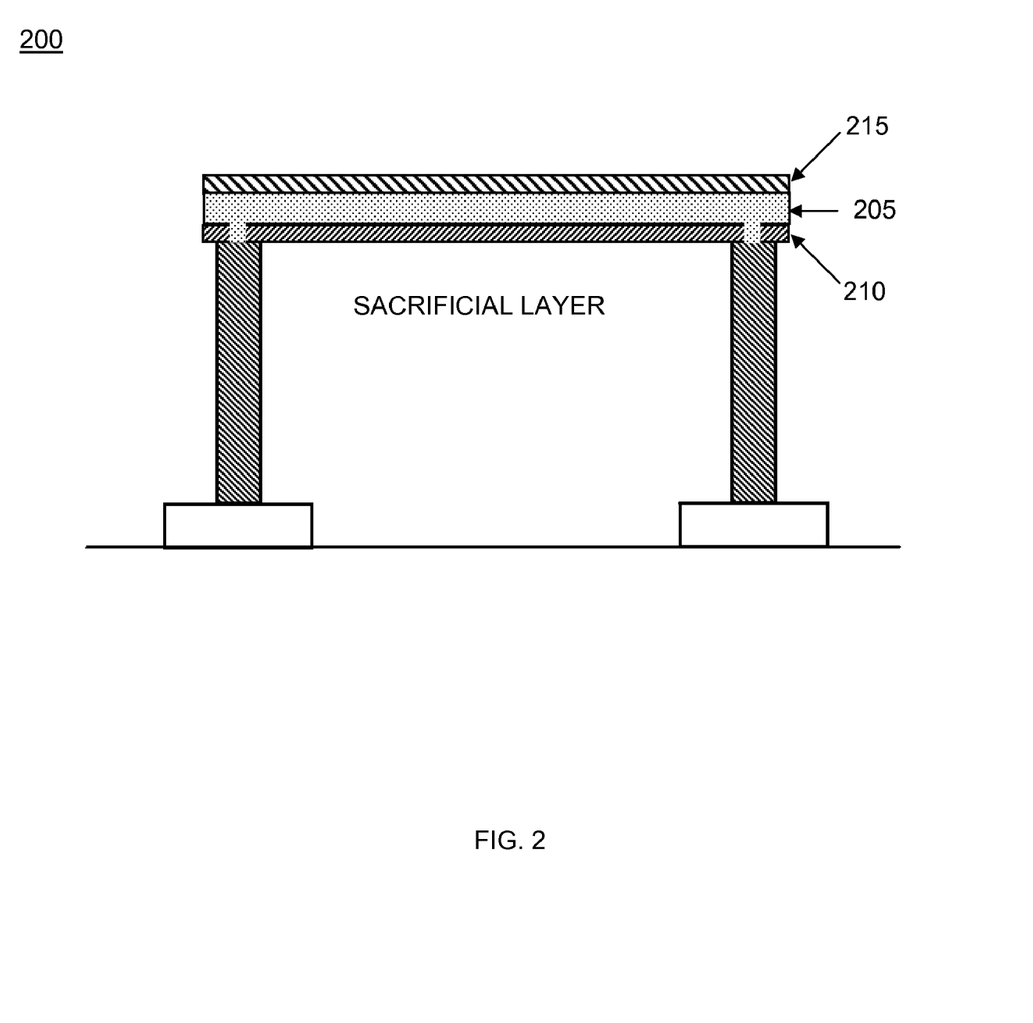
FIG. 2 is a cross section view of $VO_x$ and protective dielectric film deposition step configured in accordance with an embodiment.

FIG. 2 is a cross section view of vanadium oxide $VO_x$ and protective dielectric film deposition steps 200. Vanadium oxide $VO_x$ layer 205 is deposited on dielectric such as silicon nitride 210. The original $VO_x$ layer thickness is typically 400 to 1500 Angstroms. Protective second dielectric layer 215 is deposited on $VO_x$ layer 205. These layers are for the formation of the suspended pixel.

Figure 3:
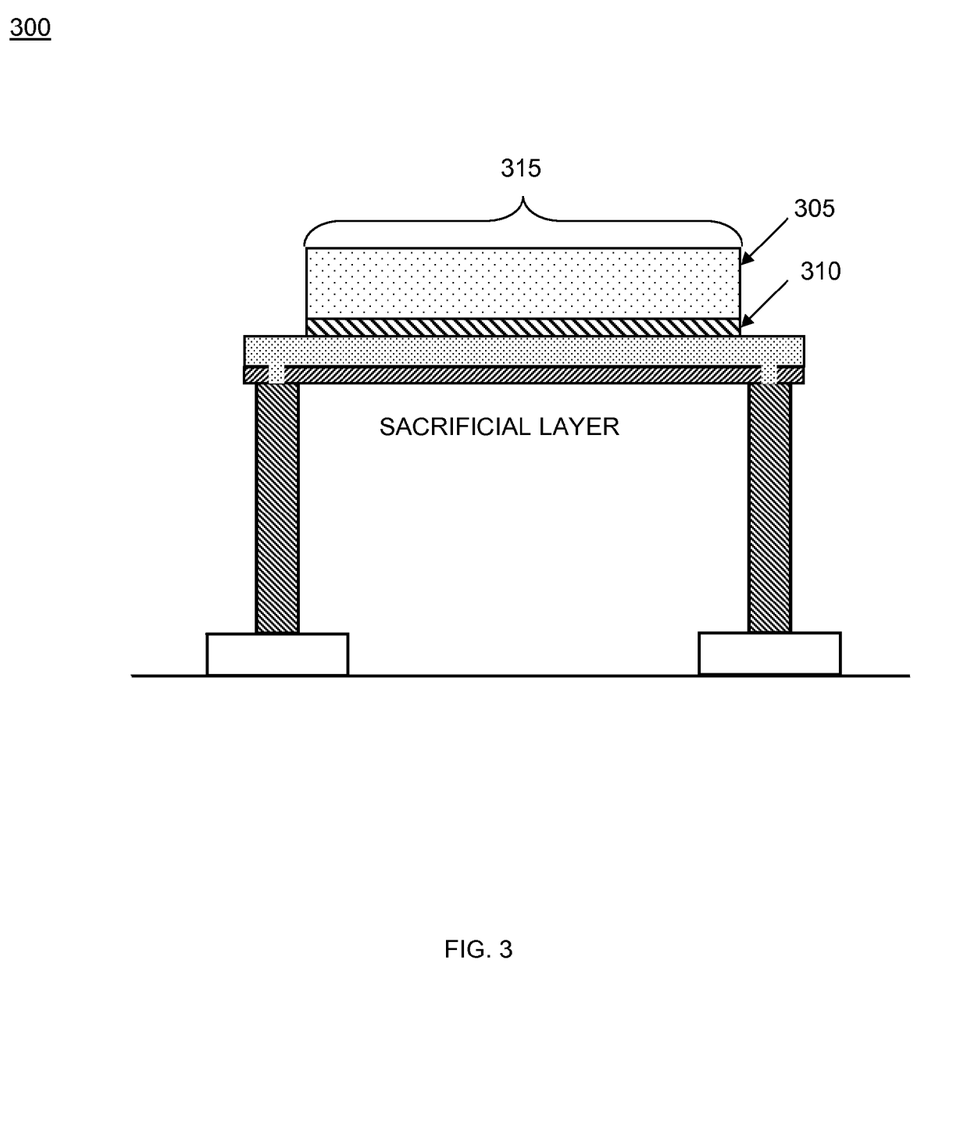
FIG. 3 is a cross section view of a photoresist deposition step and dielectric removal configured in accordance with an embodiment.

FIG. 3 is a cross section view of photoresist deposition and dielectric removal steps 300. Implant mask layer 305, such as a photoresist layer, is deposited on second dielectric such as nitride or oxide 310. Photoresist layer 305 is patterned. Dielectric 310 is removed by etching over area of pixel that is to become the legs, the contact to the metal post, and the contact to the pixel bridge. Photoresist implant mask layer 305 protects the sensing area of bridge area 315.

Figure 4:
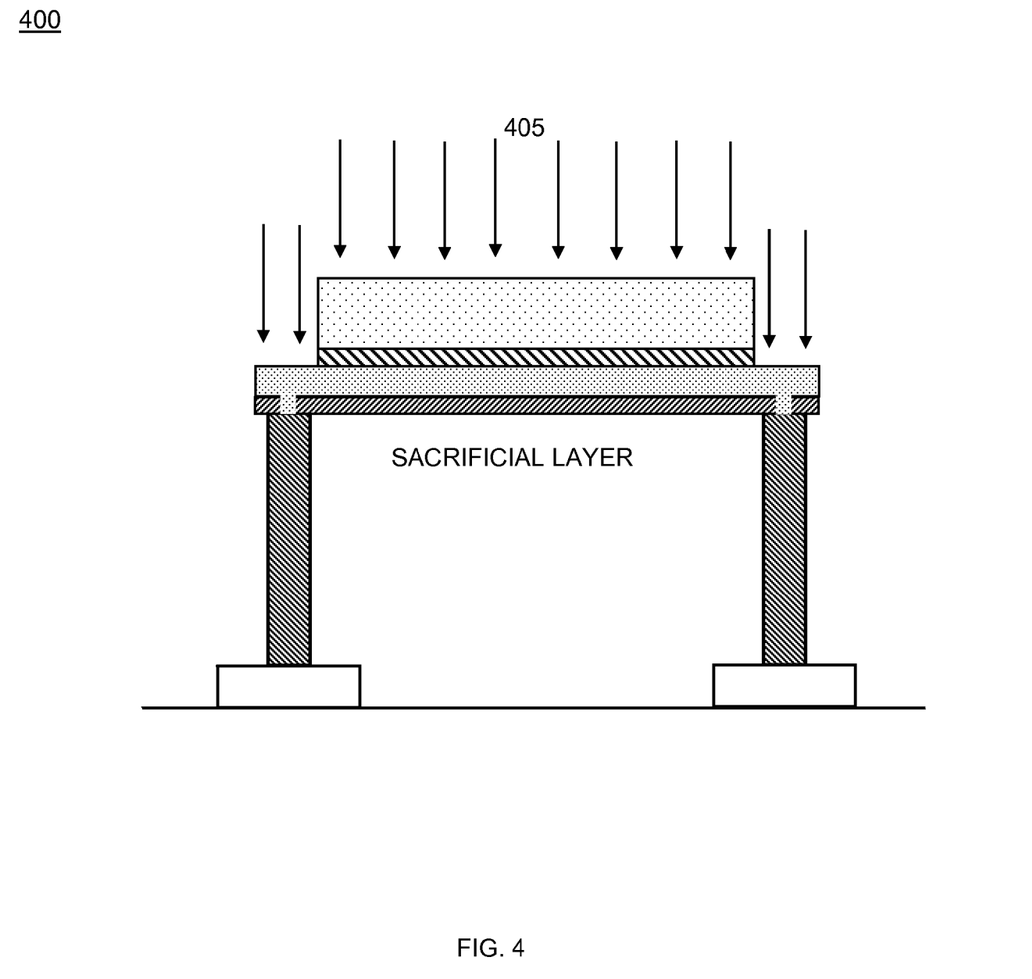
FIG. 4 is a cross section view of an ion implantation step configured in accordance with an embodiment.

FIG. 4 is a cross section view of ion implantation step 400. Implant ions 405 can consist of but are not limited to argon, krypton, or nitrogen as in the embodiments. In embodiments, implant doses and energies can vary from $1\times10^{13}$ to $5\times10^{17}$ ions/cm$^2$ with energies ranging from 2.5 KeV to greater than 40 KeV depending on the desired electrical resistivity. In practice, optimum implant doses and energies depend on the thickness of the original $VO_x$. This is a reflection of control of the conversion process. The more $VO_x$ that is converted, the lower the resistance. For embodiments, semiconductor $VO_x$ outside the sensing portion of the bridge area is converted to a metallic mixed phase vanadium oxide ($VO_x/V_2O_3/VO/V$). For other embodiments, $VO_x$ is converted to a metallic mixed phase $VO_x/V_2O_3/VO/V$ containing a VN phase in the leg area, the post area, and the detector contact area. Implantation provides better control of the conversion phases, the conversion depth and the area converted. It also allows variations in the conversion process such as selection of different implant gasses. Additionally, special attention can be given to post contact region to provide low contact resistance. In embodiments, conversion depth can be precisely and reproducibly controlled, a result not provided by sputtering. Depending on the proportions of the different phases, the resistivity of the converted $VO_x$ will typically fall to between 0.001 to 0.01 Ω-cm at room temperature.

Figure 5:
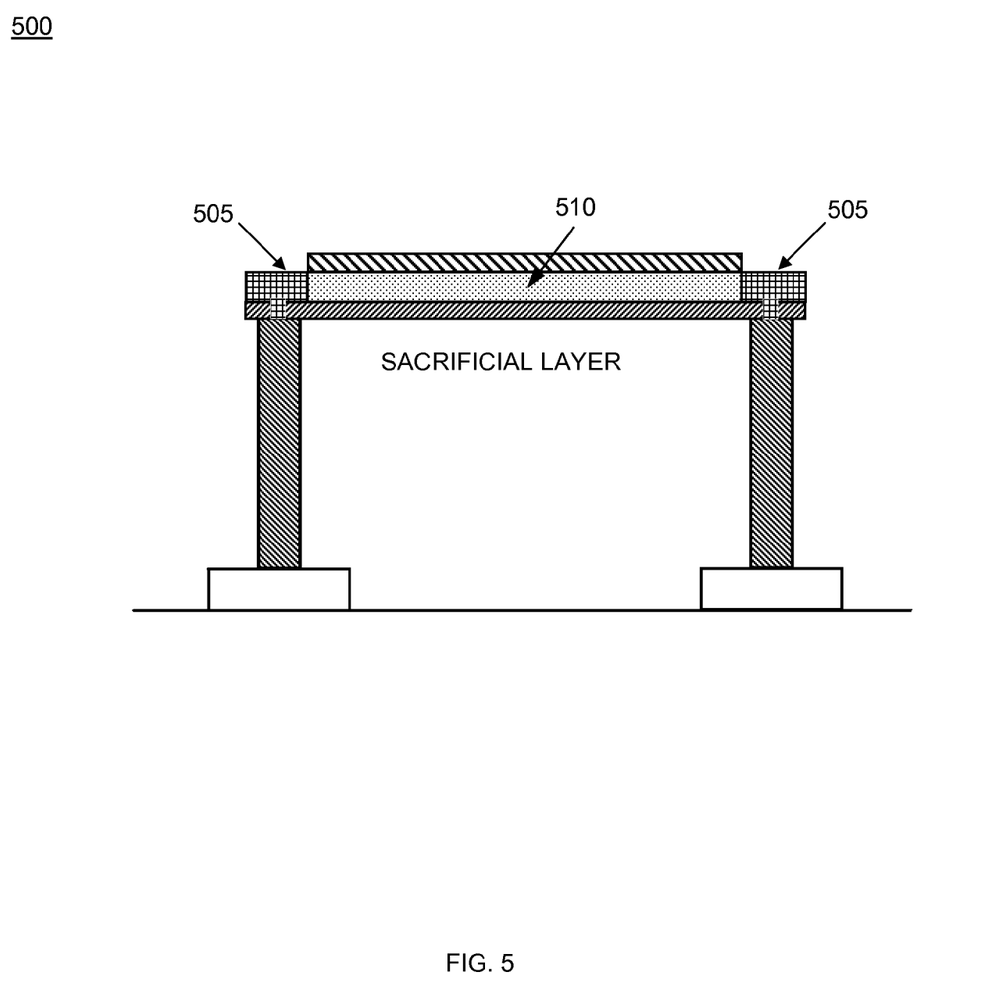
FIG. 5 is a cross section view of a photoresist mask removal step configured in accordance with an embodiment.

FIG. 5 is a cross section view of a photoresist mask removal step 500. Low resistivity regions 505 are present where vanadium oxide ($VO_x$) has been exposed to ion implant. Region 510, the sensing portion of the pixel bridge remains $VO_x$ with a higher TCR and higher resistivity.

Figure 6:
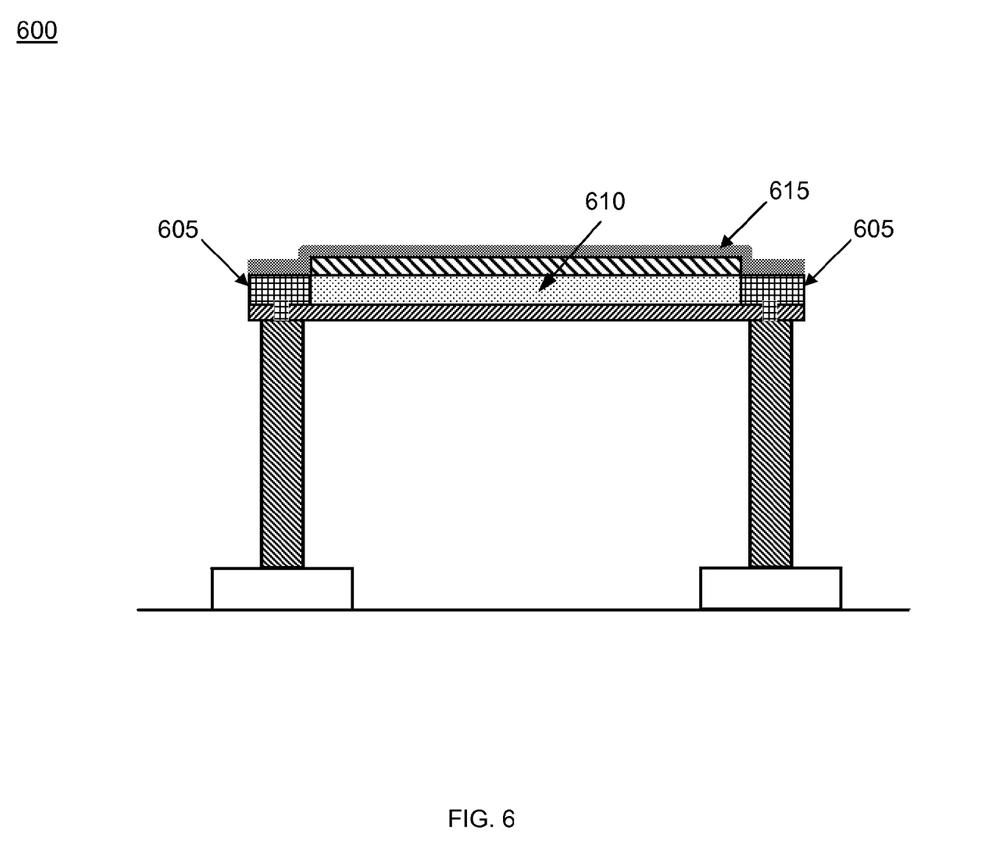
FIG. 6 is a cross section view of a capping dielectric deposition step configured in accordance with an embodiment.

FIG. 6 is a cross section view of a capping dielectric deposition step 600. Low resistivity regions 605 are beside the sensing portion of the pixel bridge region 610. The surface of each is capped by a dielectric 615 such as nitride or oxide. The bridge, the leg area, and the post area is then defined by photoresist and etched within regions 605. The sacrificial layer has been removed. A top down plan view of regions is shown in the next figure.

Figure 7:
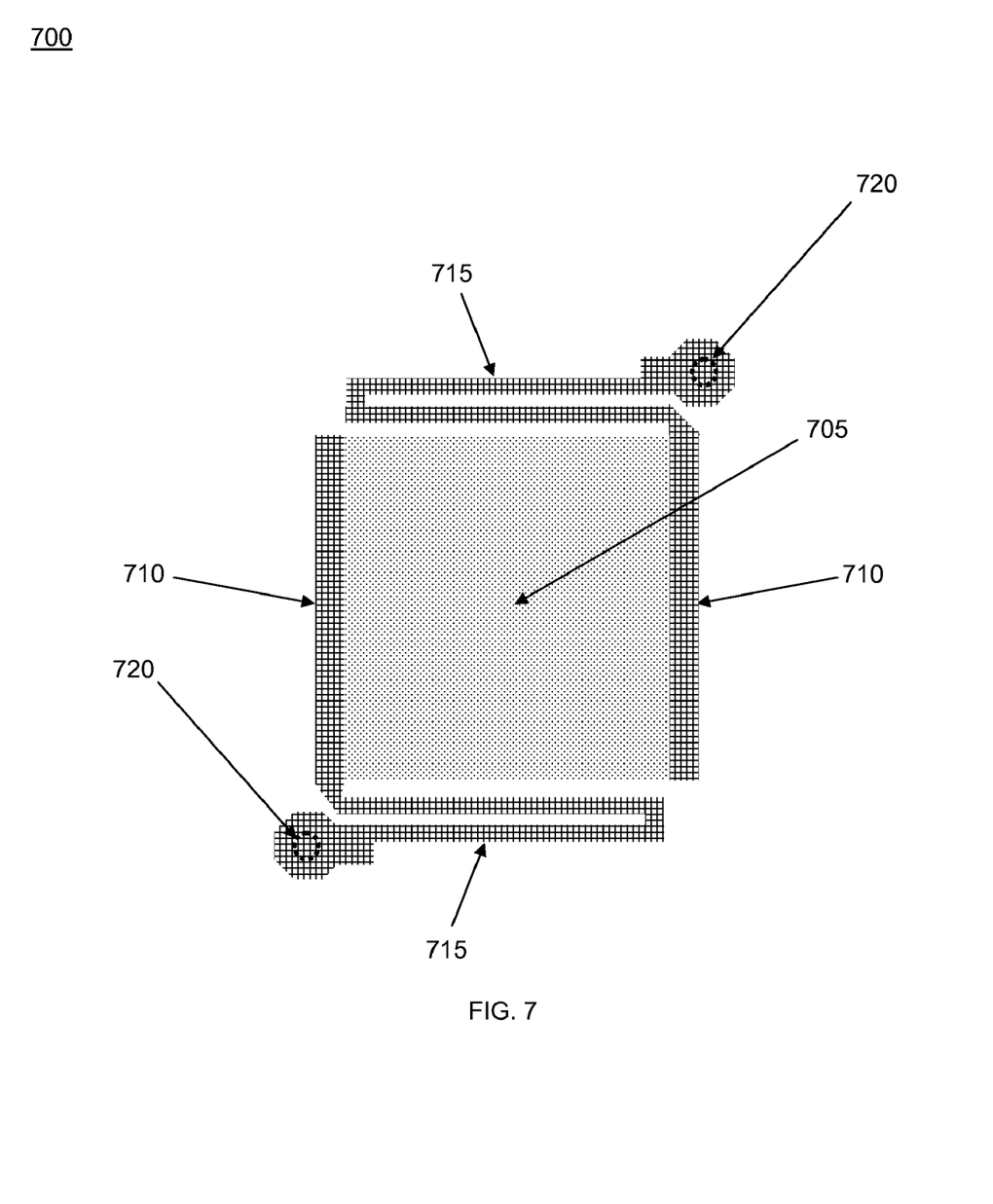
FIG. 7 is a plan view depicting areas referenced in fabrication steps configured in accordance with an embodiment. The sacrificial film has been removed.

FIG. 7 is a plan view 700 depicting an embodiment of areas referenced in fabrication steps. Region 705 depicts pixel bridge area covered and protected by mask during ion implantation that remains $VO_x$. Detector contact 710 is in previously identified low resistance region that was exposed during the implant. Region 715 depicts the pixel legs. Regions 720 identify low resistance contacts at metallized posts.

Figure 8:
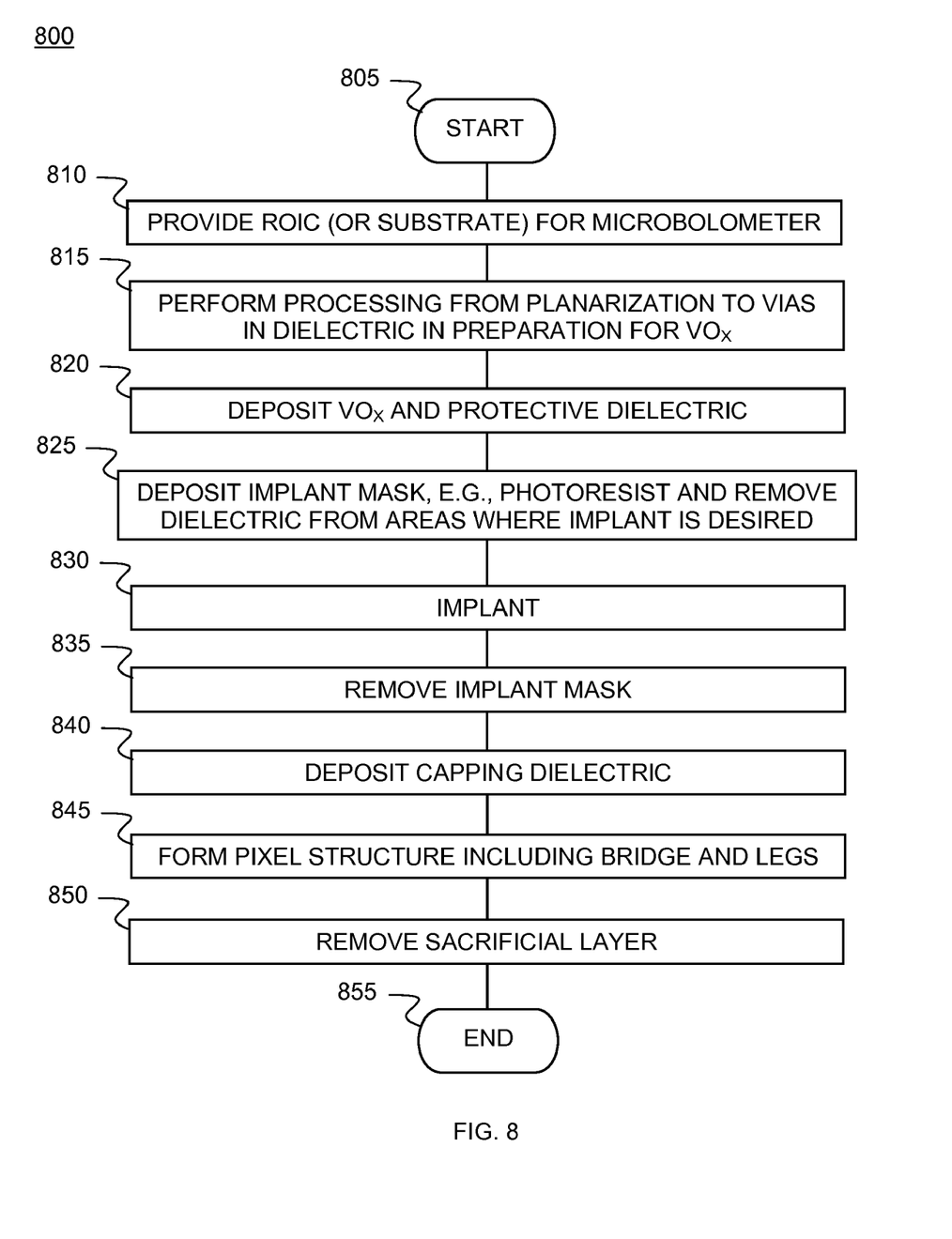
FIG. 8 is a flow chart of an embodiment of the process of FIGS. 1 through 7.

FIG. 8 depicts a flow chart 800 of an embodiment of the microbolometer fabrication process with ion implantation. It includes the steps referenced in FIGS. 1 through 7. Start 805; provide ROIC (or substrate) for microbolometer 810; perform processing from planarization to vias in dielectric in preparation for $VO_x$ 815; deposit $VO_x$ and protective dielectric 820; deposit implant mask, e.g., photoresist and remove dielectric from areas where implant is desired 825; implant 830; remove implant mask 835; deposit capping dielectric 840; form pixel structure by photolithography and etch including bridge and legs 845; remove sacrificial layer 850; and end 855.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for manufacturing at least one microbolometer pixel comprising the steps of:

providing a sacrificial layer over a substrate with at least one readout integrated circuit pad wherein a post is disposed between said at least one integrated circuit pad and a dielectric layer comprising at least one via to said post;

forming at least one $VO_x$ layer over said at least one via and said dielectric layer;

depositing a second dielectric layer on said $VO_x$ layer;

depositing an ion implant mask layer on said dielectric layer;

patterning said mask and etching said second dielectric layer leaving a protected sensing bridge region;

implanting ions whereby $VO_x$ of said $VO_x$ layer is converted to mixed phase vanadium oxide ($VO_x/V_2O_3/VO/$ V) and whereby electrical resistivity of unmasked area of said $VO_x$ layer is decreased.

2. The method of claim 1, wherein implanted area temperature coefficient of resistance (TCR) and resistivity are controlled by at least one of ion implantation dose and ion implantation energy.

3. The method of claim 1, wherein ion implanting dose is about approximately $1 \times 10^{13}$ to $5 \times 10^{17}$ ions/cm$^2$ and ion implanting energy is about approximately 2.5 KeV to 40 KeV.

4. The method of claim 1, wherein implanted area includes at least one of leg, detector contact at bridge and metallized post.

5. The method of claim 1, whereby said converted area contributes to thermal detection by increasing effective sensing area of said microbolometer pixel.

6. The method of claim 1, whereby lower thermal conductivity in converted leg area increases thermal isolation, increasing sensitivity of said microbolometer pixel.

7. The method of claim 1, wherein said step of implanting comprises a plurality of masks and implants directed at select areas to further lower resistance.

8. The method of claim 1, wherein ions of said ion implantation step are ions of at least one of argon, krypton, and nitrogen.

9. The method of claim 1 wherein said step of ion implantation comprises nitrogen ions whereby low resistivity VN is formed in said mixed phase vanadium oxide ($VO_x/V_2O_3/VO/V$).

10. A microbolometer pixel comprising:
   a substrate with at least one adjacent readout integrated circuit pad wherein a post is disposed between said at least one circuit pad and a first dielectric layer, said first dielectric layer comprising at least one via to said post;
   a $VO_x$ bridge layer disposed between said first dielectric layer and a second dielectric layer in operational contact with said post through said via;
   a dielectric cap disposed on said second dielectric layer and said bridge layer; and
   wherein said bridge layer comprises an implanted area defined by implantation of ions.

11. The microbolometer pixel of claim 10, wherein said implanted area includes at least one of leg, detector contact at bridge and post.

12. The microbolometer pixel of claim 10, wherein conversion thickness of said implanted area is controlled by at least one of ion implantation dose and ion implantation energy.

13. The microbolometer pixel of claim 10, wherein said implanted area resistivity and temperature coefficient of resistance (TCR) are controlled by at least one of ion implantation dose and ion implantation energy.

14. The microbolometer pixel of claim 10, wherein conversion thickness of said implanted area is controlled by said implantation of ions from about approximately 100 Angstroms to thickness of said $VO_x$ layer.

15. The microbolometer pixel of claim 10, wherein said implanted area resistivity is about approximately 0.001 to 0.01 Ω-cm.

16. The microbolometer pixel of claim 10 wherein said implanted area comprises VN.

17. The microbolometer pixel of claim 10 further comprising a common substrate whereon a plurality of said pixels is positioned in a focal plane array (FPA).

18. A method for manufacturing at least one microbolometer pixel comprising the steps of:
   providing a substrate with at least one readout integrated circuit pad operatively connected to at least one readout integrated circuit;
   depositing a sacrificial layer over said substrate;
   forming at least one metal-filled post between said at least one readout integrated circuit pad and a first dielectric layer;
   forming at least one via through said first dielectric layer to said at least one metal-filled post;
   forming at least one $VO_x$ layer over said first dielectric layer and filling said at least one via;
   depositing a second dielectric layer on said $VO_x$ layer;
   depositing an ion implant photoresist mask layer on said second dielectric layer;
   patterning said mask and etching said second dielectric layer leaving a protected microbolometer pixel bridge sensing region;
   implanting ions whereby $VO_x$ of said $VO_x$ layer is converted to mixed phase vanadium oxide ($VO_x/V_2O_3/VO/V$) and electrical resistivity of desired area is decreased;
   removing said mask;
   depositing a capping dielectric layer over said microbolometer pixel region;
   defining leg, bridge and post areas by photolithography and etch; and
   removing said sacrificial layer to complete formation of said at least one microbolometer pixel.

19. The method of claim 18 wherein said substrate is a common substrate, said method further comprising:
   forming a plurality of said pixels in a focal plane array (FPA) on said common substrate.

20. The method of claim 18 wherein said step of implanting ions comprises nitrogen ions whereby VN is formed in said mixed phase vanadium oxide ($VO_x/V_2O_3/VO/V$).

* * * * *